(12) United States Patent
Matsui et al.

(10) Patent No.: US 7,728,376 B2
(45) Date of Patent: Jun. 1, 2010

(54) SEMICONDUCTOR MEMORY DEVICE

(75) Inventors: Yuichi Matsui, Kawasaki (JP); Hiroshi Miki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 114 days.

(21) Appl. No.: 11/723,683

(22) Filed: Mar. 21, 2007

(65) Prior Publication Data

US 2007/0228427 A1 Oct. 4, 2007

(30) Foreign Application Priority Data

Mar. 29, 2006 (JP) .............................. 2006-091842

(51) Int. Cl.
*H01L 27/108* (2006.01)
*H01L 29/94* (2006.01)
(52) U.S. Cl. ..................... 257/310; 257/296; 257/298; 257/300; 257/306; 257/E27.034; 257/E21.648; 257/E21.649; 438/239; 438/240
(58) Field of Classification Search ............... 257/298, 257/296, 300, 306, 310, E27.034, E21.648–E21.649; 438/239–240
See application file for complete search history.

(56) References Cited

U.S. PATENT DOCUMENTS

| | | | | |
|---|---|---|---|---|
| 5,760,434 | A * | 6/1998 | Zahurak et al. | ............. 257/309 |
| 6,015,986 | A * | 1/2000 | Schuegraf | .................... 257/303 |
| 6,362,502 | B1 * | 3/2002 | Rosner et al. | ............... 257/298 |
| 6,503,791 | B2 * | 1/2003 | Matsui et al. | ............... 438/239 |
| 7,064,043 | B1 * | 6/2006 | Rouse | ........................ 438/396 |
| 2002/0030210 | A1* | 3/2002 | Matsui et al. | ............... 257/296 |
| 2003/0205772 | A1* | 11/2003 | Schaeffer et al. | ........... 257/411 |
| 2005/0152094 | A1* | 7/2005 | Jeong et al. | ................. 361/312 |

OTHER PUBLICATIONS

Zhao, Xinyuan, et al., "First-principles study of structural, vibrational, and lattice dielectric properties of hafnium oxide", The American Physical Society, Physical Review B, vol. 65, 2002, pp. 2332106-1-233106-4.
Stacy, D.W., "The Yttria-Hafnia System", Journal of The American Ceramic Society, vol. 58, No. 7, 1975, pp. 285-288.
Kita, Koji, et al., "Permittivity increase of yttrium-doped $HfO_2$ through structural phase transformation", American Institute of Physica, Applied Physics Letters 86, 2005, pp. 1-3.

* cited by examiner

*Primary Examiner*—Zandra Smith
*Assistant Examiner*—Jeremy J Joy
(74) *Attorney, Agent, or Firm*—Stites & Harbison PLLC; Juan Carlos A. Marquez, Esq.

(57) ABSTRACT

$HfO_2$ films and $ZrO_2$ films are currently being developed for use as capacitor dielectric films in 85 nm technology node DRAM. However, these films will be difficult to use in 65 nm technology node or later DRAM, since they have a relative dielectric constant of only 20-25. The dielectric constant of such films may be increased by stabilizing their cubic phase. However, this results in an increase in the leakage current along the crystal grain boundaries, which makes it difficult to use these films as capacitor dielectric films. To overcome this problem, the present invention dopes a base material of $HfO_2$ or $ZrO_2$ with an oxide of an element having a large ion radius, such as Y or La, to increase the oxygen coordination number of the base material and thereby increase its relative dielectric constant to 30 or higher even when the base material is in its amorphous state. Thus, the present invention provides dielectric films that can be used to form DRAM capacitors that meet the 65 nm technology node or later.

4 Claims, 7 Drawing Sheets

SEMICONDUCTOR MEMORY DEVICE

CLAIM OF PRIORITY

The present application claims priority from Japanese application JP 2006-091842 filed on Mar. 29, 2006, the content of which is hereby incorporated by reference into this application.

BACKGROUND OF THE INVENTION

1. Field of the Invention

The present invention relates to semiconductor devices and manufacturing methods therefore, and more particularly relates to a technique that can be advantageously applied to semiconductor devices employing capacitors, such as dynamic random access memory (DRAM), and to manufacturing methods therefore.

2. Description of the Related Art

Increasing the integration density of a semiconductor device including an LSI, such as DRAM, requires reducing the size of the capacitors in the device. However, these capacitors must still store the amount of charge required for properly reading a memory to prevent soft errors. That is, in order to enhance the integration density of a semiconductor device (such as DRAM), it is necessary to increase the amount of charge amount per unit area stored on the capacitors. As the minimum feature size of DRAM has been reduced, it has become increasingly difficult to ensure capacitors having a sufficient storage capacitance. To overcome this problem, efforts have been made to use a high dielectric constant material as a capacitor dielectric film. Examples of such materials include $Al_2O_3$ (having a relative dielectric constant of approximately 9), $HfO_2$ (having a relative dielectric constant of approximately 20-25), $ZrO_2$ (having a relative dielectric constant of approximately 20-25), and $Ta_2O_5$ (having a relative dielectric constant of approximately 25). These materials are intended to replace $SiO_2$ (having a relative dielectric constant of approximately 4) and $Si_3N_4$ (having a relative dielectric constant of approximately 7), which have been used as capacitor dielectric films.

Further, in the case of gigabit generation DRAMs, which have a critical dimension (or minimum feature size) of 0.1 μm or less, the capacitors must have a three-dimensional shape even if they are formed of a high dielectric constant material, in order to store an increased amount of charge. (Examples of such three-dimensional capacitors include trench capacitors and stacked capacitors.) Therefore, it is necessary to deposit the dielectric film by CVD (Chemical Vapor Deposition), which is a superior technique in terms of covering step portions (or uneven portions). That is, in order to manufacture gigabit generation DRAM, it is essential to establish and use an appropriate deposition technique (based on CVD), as well as using a high dielectric constant material having good electrical characteristics. It should be noted that ALD (Atomic Layer Deposition) is a type of CVD and is used to form a dielectric film by alternately supplying an organometallic material and an oxidant.

Conventional DRAMs have employed capacitors having an MIS (Metal-Insulator-Semiconductor) structure in which the lower electrode is made up of a polysilicon film. However, the MIS structure is disadvantageous in that it is difficult to reduce the EOT (Effective Oxide Thickness) of the dielectric film, since an $SiO_2$ layer grows at the interface between the lower electrode and the dielectric film during formation of the film and during the postheat treatment and reduces the effective storage capacitance. Therefore, in order to achieve an EOT of 1.5 nm or less, a capacitor must have an MIM (Metal-Insulator-Metal) structure in which the lower electrode is formed of a metal material to eliminate any parasitic capacitance. It should be noted, however, that the above $SiO_2$ layer formed at the interface between the lower electrode and the dielectric film in the MIS capacitor structure contributes significantly to reduction of the leakage current although its capacitance (parasitic capacitance) reduces the storage capacitance, as described above. On the other hand, since the MIM capacitor structure does not have such an $SiO_2$ layer, the dielectric film itself must be formed to have a reduced leakage current. However, it is not easy to implement such a dielectric film forming method. An exemplary conventional MIM capacitor structure that can be applied to DRAM is the TiN/$Al_2O_3$/TiN structure in which the upper and lower electrodes are made up of a TiN film and the dielectric film is formed of $Al_2O_3$. Further, MIM capacitor structures using an $HfO_2$ dielectric film or an $HfO_2$ aluminate dielectric film (a laminated structure of $HfO_2$ and $Al_2O_3$) have been investigated for use in the next generation DRAM.

According to the International Technology Roadmap for Semiconductors (ITRS), 65 nm technology node DRAM requires capacitors having an EOT of 0.8 nm or less. If the minimum allowable physical thickness of the dielectric film is assumed to be 6 nm to reduce the direct tunneling current, the dielectric film must have a relative dielectric constant of higher than 30 to have an EOT of 0.8 nm or less.

Since $Al_3O_3$ films (which are currently used in DRAM) have a relative dielectric constant of only approximately 9, they cannot be used in 65 nm technology node DRAM. $HfO_2$ films (which are currently being developed to meet the 85 nm technology node) and $HfO_2$ aluminate films are also difficult to use in 65 nm technology node DRAM, since $HfO_2$ films have a relative dielectric constant of only 20-25 and $HfO_2$ aluminate films have a relative dielectric constant intermediate between those of $HfO_2$ and $Al_2O_3$ films. (The actual value of the relative dielectric constant of each $HfO_2$ aluminate film depends on its composition.) That is, there are no capacitor dielectric materials currently available that meet the 65 nm-technology node.

It is expected that 85 nm technology node DRAM will have an MIM capacitor structure in which the upper and lower electrodes are made up of a TiN film and the dielectric is formed of $HfO_2$ or $HfO_2$ aluminate. Therefore, it is desirable that 65 nm technology node DRAM capacitors also employ TiN electrodes to maintain technical consistency. With TiN electrodes, the dielectric must be made of a material that is more stable in oxide form than $TiO_2$. That is, if the dielectric material has a larger free energy of oxide formation than $TiO_2$ (for example, if it is $Ta_2O_5$), the dielectric film (or material) oxidizes the TiN electrodes, resulting in reduced effective capacitance and/or increased leakage current. Therefore, it may be preferable to use a dielectric material having a lower free energy of oxide formation than $TiO_2$ (that is, having a higher absolute free energy value of oxide formation than $TiO_2$), such as $Al_2O_3$, $HfO_2$, or $ZrO_2$ to stabilize the interface. Since the relative dielectric constant of $Al_2O_3$ is low (approximately 9), it is desirable to develop a dielectric material that includes as a base material $HfO_2$ or $ZrO_2$, which have a high relative dielectric constant (20-25).

That is, to meet the 65 nm technology node, DRAM capacitors must be formed of a dielectric material that has a relative dielectric constant of higher than 30 and that includes as a base material $HfO_2$ or $ZrO_2$, which are more stable in oxide form than $TiO_2$.

As is known, post-treating an amorphous $HfO_2$ film at approximately 400° C. crystallizes the film and stabilizes its monoclinic phase. Further, the relative dielectric constant of an $HfO_2$ film depends on its crystalline structure; namely, the relative dielectric constant of the monoclinic phase is 16-18, that of the cubic phase is 29, and that of the tetragonal phase is 70 (see Physical Review, vol. B65, 2002, page 233106 (Nonpatent Document 1)). That is, the relative dielectric constant of an $HfO_2$ film decreases from 20-25 to 16-18 when the film crystallizes from its amorphous phase to monoclinic phase. A phase diagram indicates that: the low-temperature stable phase of $HfO_2$ is the monoclinic phase; and $HfO_2$ undergoes the phase transition from the monoclinic phase to the tetragonal phase at 1750° C., and the phase transition from the tetragonal phase to the cubic phase at 2700° C. (see Journal of American Ceramic Society, vol. 58, 1975, page 285 (Nonpatent Document 2)). That is, $HfO_2$ occurs only as a monoclinic phase at present semiconductor process temperatures; it cannot exist as a cubic or tetragonal phase in a thermal equilibrium state at these temperatures.

It was recently reported that heat-treating $HfO_2$ doped with 4 or more at. % $Y_2O_3$ at approximately 600° C. stabilizes the cubic phase and thereby increases the relative dielectric constant to approximately 27 (see Applied Physics Letters, vol. 86, 2005, page 102906 (Nonpatent Document 3)). This research was undertaken to use a $Y_2O_3$-doped $HfO_2$ film as a gate insulating film. It is already known that doping $ZrO_2$ with $Y_2O_3$ stabilizes the cubic phase at low temperature. Therefore, it is thought that the same mechanism caused the stabilization of the $HfO_2$ low-temperature stable phase (i.e., the cubic phase).

SUMMARY OF THE INVENTION

An essential feature of the present invention is that it provides capacitor dielectric layers formed of the following: (1) a solid solution of hafnium oxide and yttrium oxide, or a layer stack of hafnium oxide and yttrium oxide; (2) a solid solution of hafnium oxide and lanthanum oxide, or a layer stack of hafnium oxide and lanthanum oxide; (3) a solid solution of zirconium oxide and yttrium oxide, or a layer stack of zirconium oxide and yttrium oxide; or (4) a solid solution of zirconium oxide and lanthanum oxide, or a layer stack of zirconium oxide and lanthanum oxide. That is, each capacitor dielectric layer of the present invention is a solid solution or a layer stack made of one of the combinations of materials described above. Specifically, major aspects of the present invention provide the following four semiconductor memory devices.

A first semiconductor memory device comprises: a substrate; a MOS transistor disposed on the substrate; a plug electrically connected to a source region or a drain region of the MOS transistor; a lower electrode of a metal material electrically connected to the plug; a dielectric layer disposed on the lower electrode and made up of either a solid solution of hafnium oxide and yttrium oxide or a layer stack of hafnium oxide and yttrium oxide; and an upper electrode of a metal material disposed on the dielectric layer; wherein the upper and lower electrodes and the dielectric layer form a capacitor; and wherein the dielectric layer is a film formed by chemical vapor deposition to a thickness of 5 nm-10 nm.

A second semiconductor memory device comprises: a substrate; a MOS transistor disposed on the substrate; a plug electrically connected to a source region or a drain region of the MOS transistor; a lower electrode of a metal material electrically connected to the plug; a dielectric layer disposed on the lower electrode and made up of either a solid solution of hafnium oxide and lanthanum oxide or a layer stack of hafnium oxide and lanthanum oxide; and an upper electrode of a metal material disposed on the dielectric layer; wherein the upper and lower electrodes and the dielectric layer form a capacitor; and wherein the dielectric layer is a film formed by chemical vapor deposition to a thickness of 5 nm-10 nm.

A third semiconductor memory device comprises: a substrate; a MOS transistor disposed on the substrate; a plug electrically connected to a source region or a drain region of the MOS transistor; a lower electrode of a metal material electrically connected to the plug; a dielectric layer disposed on the lower electrode and made up of either a solid solution of zirconium oxide and yttrium oxide or a layer stack of zirconium oxide and yttrium oxide; and an upper electrode of a metal material disposed on the dielectric layer; wherein the upper and lower electrodes and the dielectric layer form a capacitor; and wherein the dielectric layer is a film formed by chemical vapor deposition to a thickness of 5 nm-10 nm.

A fourth semiconductor memory device comprises: a substrate; a MOS transistor disposed on the substrate; a plug electrically connected to a source region or a drain region of the MOS transistor; a lower electrode of a metal material electrically connected to the plug; a dielectric layer disposed on the lower electrode and made up of either a solid solution of zirconium oxide and lanthanum oxide or a layer stack of zirconium oxide and lanthanum oxide; and an upper electrode of a metal material disposed on the dielectric layer; wherein the upper and lower electrodes and the dielectric layer form a capacitor; and wherein the dielectric layer is a film formed by chemical vapor deposition to a thickness of 5 nm-10 nm.

Thus, the present invention provides semiconductor memory devices that meet the 65 nm technology node or later. These semiconductor memory devices employ a dielectric layer having a thickness of 5 nm-10 nm.

The present invention allows even an amorphous dielectric film to have a high relative dielectric constant. This makes it possible either to increase the amount of signal charge stored on the capacitors in DRAM and thereby enhance the operating reliability of the DRAM, or to reduce the height of these capacitors and thereby reduce the process load.

Before describing preferred embodiments of the present invention in detail, it will be helpful to describe capacitor dielectric films of the present invention in detail.

The materials described in the above nonpatent documents are difficult to use to form a capacitor dielectric film that satisfies the 65 nm technology node, since they have problems as described above. Furthermore, for example, if $HfO_2$ or $ZrO_2$ (doped with $Y_2O_3$) is crystallized as described in Nonpatent Document 3, the leakage current along crystal grain boundaries increases, which makes it difficult to use the material as a capacitor dielectric film, since the maximum allowable leakage current density of capacitor dielectric films is a few orders of magnitude lower than that of gate insulating films.

To address this problem, we prepared an amorphous solid solution of $HfO_2$ and $Y_2O_3$ and examined its electrical characteristics. It was found that this amorphous material had a significantly reduced leakage current and an increased relative dielectric constant (30 or more), as compared to the crystalline state. To date, there has been no report that an amorphous material exhibits an increased relative dielectric constant when doped. It is obvious that such an increase in relative dielectric constant is not due to stabilization of the cubic phase.

Thus, the relative dielectric constant of $HfO_2$ increases when it is doped with $Y_2O_3$. This is possibly because of an increase in the oxygen coordination number of the material. Y (yttrium) has an ion radius of 1.02 Å, which is larger than the ion radius of Hf (0.83 Å). As is known in the art, when an oxide is doped with an element having a large ion radius, its oxygen coordination number increases due to steric hindrance. It should be noted that the stable phase of $HfO_2$ is monoclinic and is 7-coordinated, whereas $HfO_2$ doped with Y, which has a larger ion radius than $HfO_2$, is cubic and is 8-coordinated. However, it is thought that the direct cause of the above increase in the relative dielectric constant of $HfO_2$ (when doped with $Y_2O_3$) is not the transition of the stable phase of $HfO_2$ from the monoclinic phase to cubic phase, but the increase in the oxygen coordination number of the material itself.

This means that $La_2O_3$ doping will also increase the relative dielectric constant of $HfO_2$ since La has a large ion radius (1.16 Å). By the same token, $Y_2O_3$ doping and $La_2O_3$ doping will increase the relative dielectric constant of $ZrO_2$.

To prove this supposition, we prepared amorphous solid solutions of $HfO_2$—$La_2O_3$, $ZrO_2$—$Y_2O_3$, and $ZrO_2$—$La_2O_3$ and examined their electrical characteristics. It was found that these solid solutions had a significantly reduced leakage current and an increased relative dielectric constant (30 or more), as compared to the crystalline state, as in the case of the solid solution of $HfO_2$—$Y_2O_3$. That is, the relative dielectric constant of a base material made of $HfO_2$ or $ZrO_2$ can be increased by doping it with an oxide of an element having a large ion radius, such as $Y_2O_3$ or $La_2O_3$, and thereby increasing the oxygen coordination number of the base material. In this way, it is possible to provide a DRAM capacitor dielectric film that meets the 65 nm technology node.

It should be noted that the proportion of the oxide dopant is preferably 5-50%, more preferably 7-50%. If the proportion of the oxide dopant is too low, the oxygen coordination number and hence the relative dielectric constant of the base material do not increase. On the other hand, if the proportion is too high, phase separation occurs between the oxide base material and the oxide dopant, which also prevents an increase in the relative dielectric constant of the base material.

Since the capacitors in high density DRAM have a three dimensional structure, their dielectric film must be deposited by CVD, which allows for high step coverage. For example, a Y-containing organometallic material and an Hf-containing organometallic material may be introduced into an oxidizing atmosphere to form a $Y_2O_3$-doped $HfO_2$ film; a Y-containing organometallic material and a Zr-containing organometallic material may be introduced into an oxidizing atmosphere to form a $Y_2O_3$-doped $ZrO_2$ film; an La-containing organometallic material and an Hf-containing organometallic material may be introduced into an oxidizing atmosphere to form an $La_2O_3$-doped $HfO_2$ film; and an La-containing organometallic material and a Zr-containing organometallic material may be introduced into an oxidizing atmosphere to form an $La_2O_3$-doped $ZrO_2$ film.

When forming a dielectric film by ALD, a plurality of organometallic materials cannot be introduced at the same time, that is, they are supplied alternately and the resultant dielectric film has a laminated structure. If each oxide base material layer and each oxide dopant layer are denoted by A and B, respectively, the laminated structure, or layer stack, may include (in the order of increasing distance from the lower electrode) A, B, A, B, A, B, and so on. Or the laminated structure may not include as many oxide dopant layers as there are oxide base material layers, that is, for example, it may include (in the order of increasing distance from the lower electrode) A, A, B, A, A, B, A, A, B, and so on. Like a solid solution dielectric film, a dielectric film with such a laminated structure has an increased oxygen coordination number and hence an increased relative dielectric constant, as compared to conventional dielectric films. However, the oxide materials of the dielectric film in contact with the upper and lower electrodes must be selected based on physical properties of the materials of the upper and lower electrodes. For example, with TiN electrodes, the laminated structure of the dielectric film is preferably formed such that oxide materials having a lower free energy of oxide formation than $TiO_2$ are in contact with the electrodes. Further, in order to reduce the leakage current density of the capacitor, the laminated structure is preferably formed such that dielectric materials having a large band gap or a large band offset with respect to the electrode material are in contact with the electrodes.

Specifically, since $Y_2O_3$ and $La_2O_3$ usually have a larger band gap than $HfO_2$ and $ZrO_2$, the laminated structure may be formed such that $Y_2O_3$ or $La_2O_3$ is in contact with the lower electrode. However, $HfO_2$ and $ZrO_2$ may have a larger band offset with respect to the lower electrode (of titanium nitride or ruthenium) than $Y_2O_3$ and $La_2O_3$, depending on the forming method. In such a case, the laminated structure may be formed such that $HfO_2$ or $ZrO_2$ is in contact with the lower electrode.

As can be appreciated from the above description, the relative dielectric constant of a base material made of $HfO_2$ or $ZrO_2$ can be increased by doping it with an oxide of an element having a large ion radius, such as Y or La, and thereby increasing the oxygen coordination number of the base material. In this way, it is possible to provide a DRAM capacitor dielectric film that meets the 65 nm technology node or later.

DETAILED DESCRIPTION OF THE PREFERRED EMBODIMENTS

Preferred embodiments of the present invention will now be described in detail with reference to the accompanying drawings. It should be noted that in the following figures, like numerals will be used to denote components having like functions to avoid undue repetition.

First Embodiment

A first embodiment of the present invention will be described with reference to FIGS. 1A to 1D. These figures are cross-sectional views showing an MIM capacitor structure that employs a dielectric film doped with an element having a large ion radius. For example, this MIM capacitor structure can be applied to semiconductor memory devices, especially DRAM.

Figure 1A:
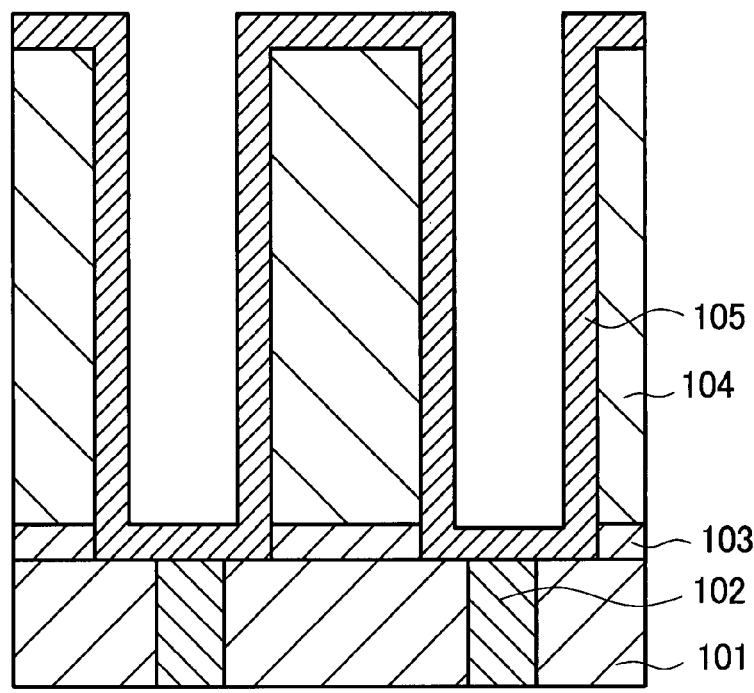
FIGS. 1A to 1D are vertical cross-sectional views illustrating sequential process steps for forming an MIM capacitor structure according to a first embodiment of the present invention.
Figure 1B:
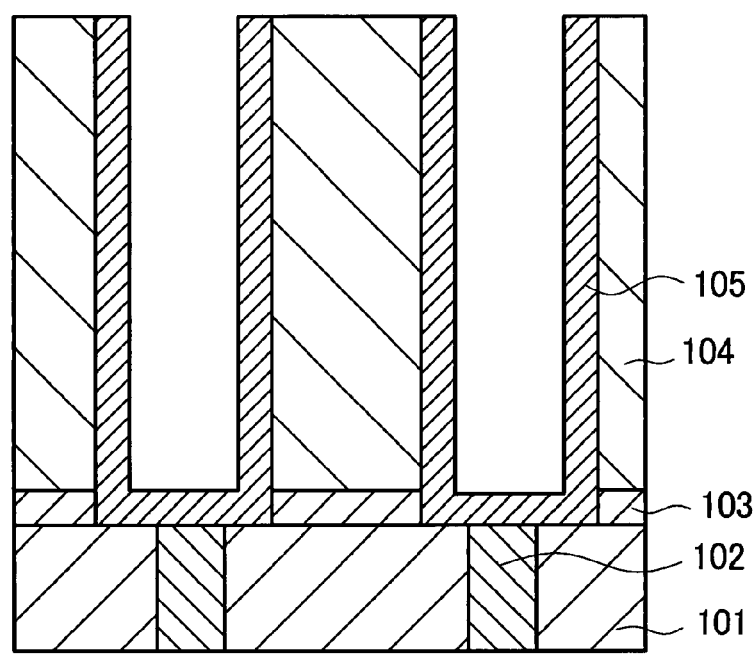

First, the steps before and including the step of forming the lower electrode will be described with reference to FIGS. 1A and 1B. Referring to FIG. 1A, plugs 102 of polysilicon are formed in a plug section interlayer insulating film 101 made up of a silicon oxide film. The plugs 102 are provided to electrically connect between the memory cell select transistor and the capacitor.

Then, a silicon nitride film 103 and a capacitor section interlayer insulating film 104 made up of a silicon oxide film are deposited, and trenches are formed in these films so as to expose the plugs 102. The capacitor section interlayer insulating film 104 is deposited by plasma CVD using tetraethoxysilane (TEOS) and ozone ($O_3$) as source materials. Further, the trenches are formed by dry etching using a photoresist as a mask.

Then, a lower electrode 105 of titanium nitride is formed. Specifically, first, a titanium nitride film is deposited over the entire surface of the substrate to a thickness of, e.g., 15 nm, as shown in FIG. 1A. Then, a photoresist (not shown) is deposited over the entire surface of the substrate to fill the trenches. After that, the portions of the photoresist and the titanium nitride film on the top surface of the capacitor section interlayer insulating film 104 are removed by sputter etching. Then, the photoresist remaining in the trenches is removed by ashing, thus forming the lower electrode 105 of titanium nitride, as shown in FIG. 1B.

Figure 1C:
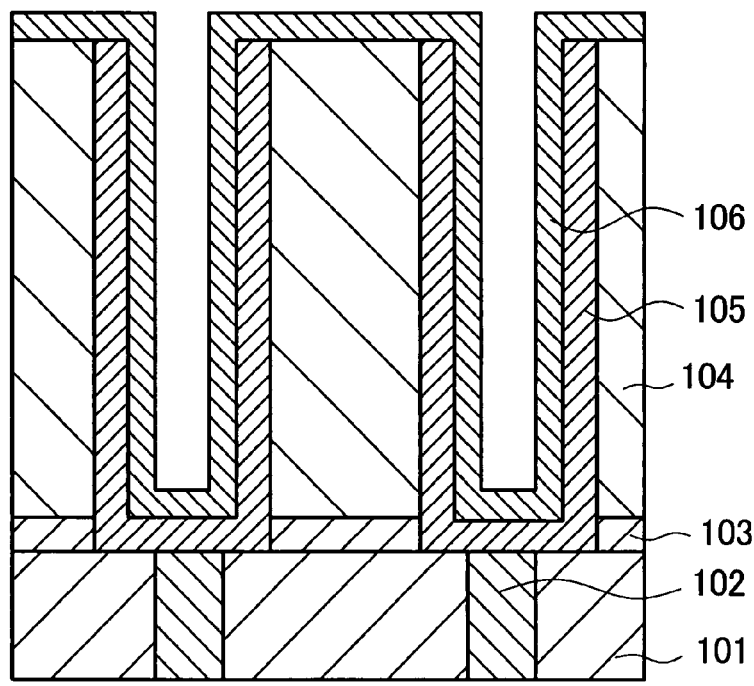

Then, a dielectric film 106 doped with an element having a large ion radius is deposited over the entire surface of the substrate by CVD, as shown in FIG. 1C. The dielectric film 106 may be a $Y_2O_3$-doped $HfO_2$ film, a $Y_2O_3$-doped $ZrO_2$ film, an $La_2O_3$-doped $HfO_2$ film, or a $La_2O_3$-doped $ZrO_2$ film, etc. The thickness of the dielectric film 106 must be at least 5 nm to reduce the direct tunneling current, and be 10 nm or less to provide a sufficient capacitance. The dielectric film 106 is preferably amorphous to reduce the leakage current along the crystal grain boundaries. However, the dielectric film 106 may be made of a polysilicon dielectric if its leakage current density does not exceed the maximum allowable value.

Examples of CVD materials are as follows: tetrakis(ethylmethylamido)hafnium for $HfO_2$; tetrakis(ethylmthylamido)zirconium for $ZrO_2$; tris(N,N'-diisopropylacetamidinate)yttrium for $Y_2O_3$; and tris(N,N'-diisopropylacetamidinate)lanthanum for $La_2O_3$. Examples of oxidants include $O_3$ and $H_2O$.

Figure 1D:
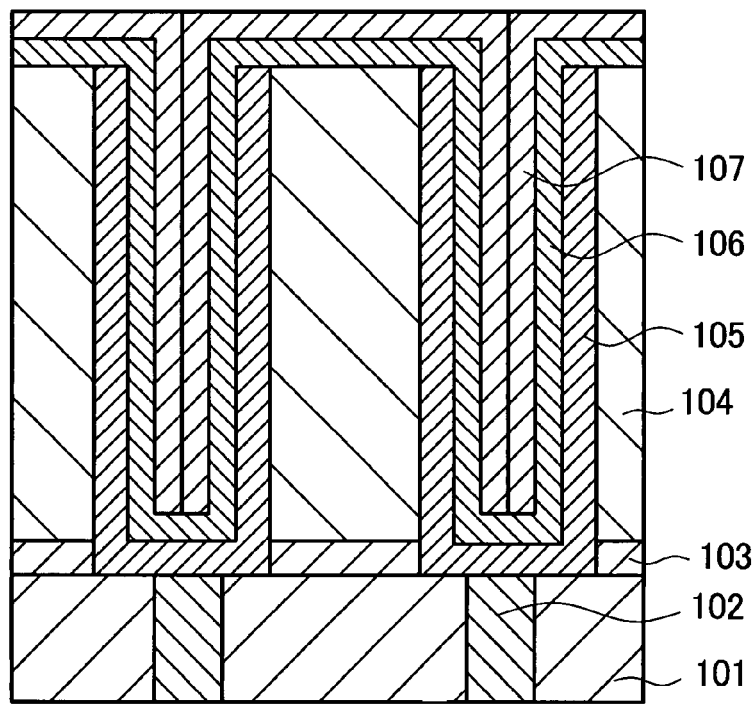

Then, a titanium nitride film is deposited onto the dielectric film 106 to a thickness of, e.g., 15 nm by CVD. After that, a photoresist is formed on the titanium nitride film, and then the titanium nitride film and the dielectric film 106 are patterned by dry etching using this photoresist as a mask to form an upper electrode 107, as shown in FIG. 1D.

This completes the formation of the capacitor made up of the lower electrode 105 of titanium nitride, the dielectric film 106, and the upper electrode 107 of titanium nitride. For example, this capacitor may be coupled in series to a DRAM memory cell select transistor to form a DRAM memory cell.

It should be noted that either the upper or lower electrode or both may be formed of ruthenium instead of titanium nitride. Since ruthenium is conductive even when oxidized, the use of a ruthenium electrode permits the capacitor to have a smaller EOT, as compared to the use of a titanium nitride electrode.

The present embodiment allows formation of an MIM capacitor structure having an EOT of 0.8 nm or less by using a dielectric film doped with an element having a large ion radius. This makes it possible to provide DRAM that meets the 65 nm technology node.

It should be noted that the present invention is not limited to the preferred embodiments described above. It is obvious that the present invention embraces all means described in the "Summary of the Invention" section of this specification.

Second Embodiment

A second embodiment of the present invention will be described with reference to FIGS. 2A to 2D. These figures are cross-sectional views showing an MIM capacitor structure that employs a dielectric film doped with an element having a large ion radius. For example, this MIM capacitor structure can be applied to semiconductor memory devices, especially DRAM. It should be noted that the MIM capacitor structure of the present embodiment differs from that of the first embodiment in that portions of the outer sidewalls of the lower electrode are used to form capacitance.

Figure 2A:
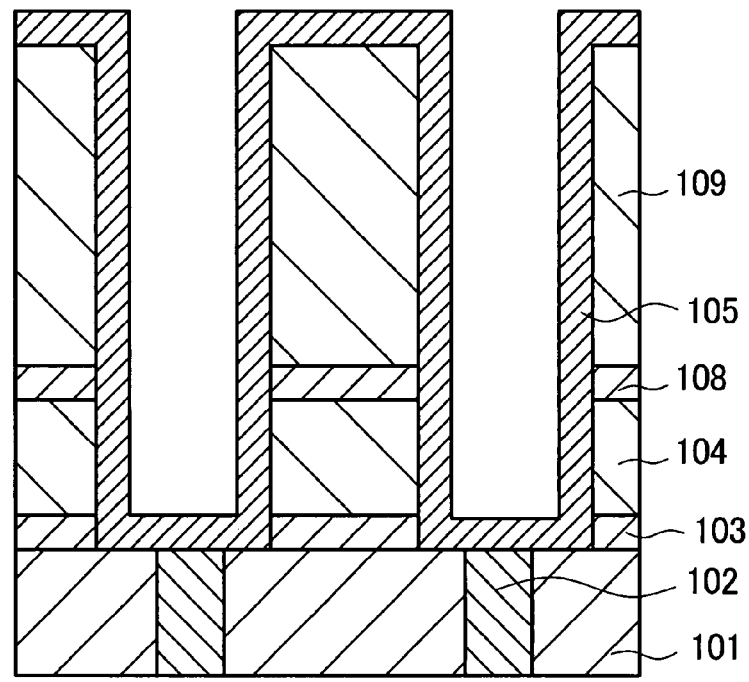
FIGS. 2A to 2D are vertical cross-sectional views illustrating sequential process steps for forming an MIM capacitor structure according to a second embodiment of the present invention.
Figure 2B:
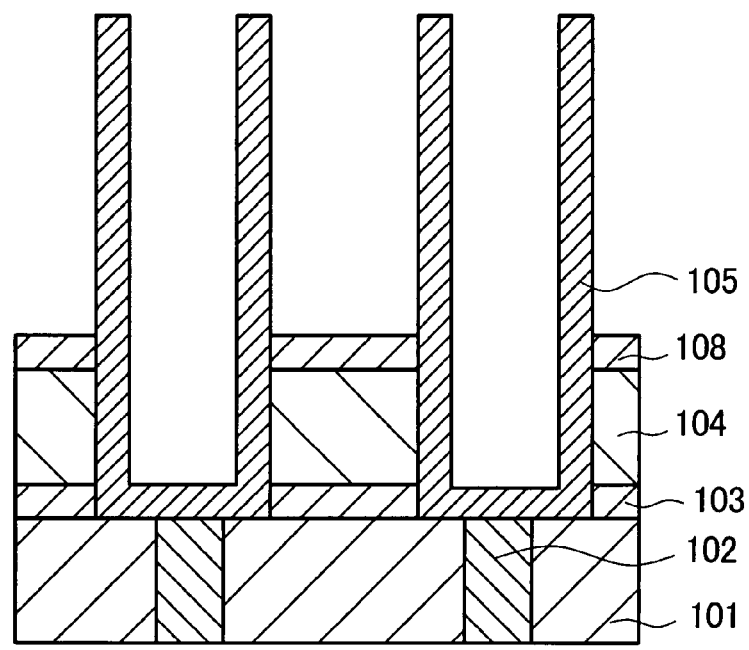

First, the steps before and including the step of forming the lower electrode will be described with reference to FIGS. 2A and 2B. Referring to FIG. 2A, plugs 102 of polysilicon are formed in a plug section interlayer insulating film 101 made up of a silicon oxide film. The plugs 102 are provided to electrically connect between the memory cell select transistor and the capacitor.

Then, the following films are sequentially deposited: a silicon nitride film 103; a capacitor section interlayer insulating film 104 made up of a silicon oxide film; a silicon nitride film 108; and a capacitor section interlayer insulating film 109 made up of a silicon oxide film. After that, trenches are formed in these films so as to expose the plugs 102. The capacitor section interlayer insulating films 104 and 109 are deposited by plasma CVD using tetraethoxysilane (TEOS) and ozone ($O_3$) as source materials. Further, the trenches are formed by dry etching using a photoresist as a mask.

Then, a lower electrode 105 of titanium nitride is formed. Specifically, first, a titanium nitride film is deposited over the entire surface of the substrate to a thickness of, e.g., 15 nm, as shown in FIG. 2A. Then, a photoresist (now shown) is deposited over the entire surface of the substrate to fill the trenches. After that, the portions of the photoresist and the titanium nitride film on the top surface of the capacitor section interlayer insulating film 109 are removed by sputter etching. Then, the photoresist remaining in the trenches is removed by ashing, and the capacitor section interlayer insulating film 109 is removed by wet etching, thus forming the lower electrode 105 of titanium nitride, as shown in FIG. 2B.

Figure 2C:
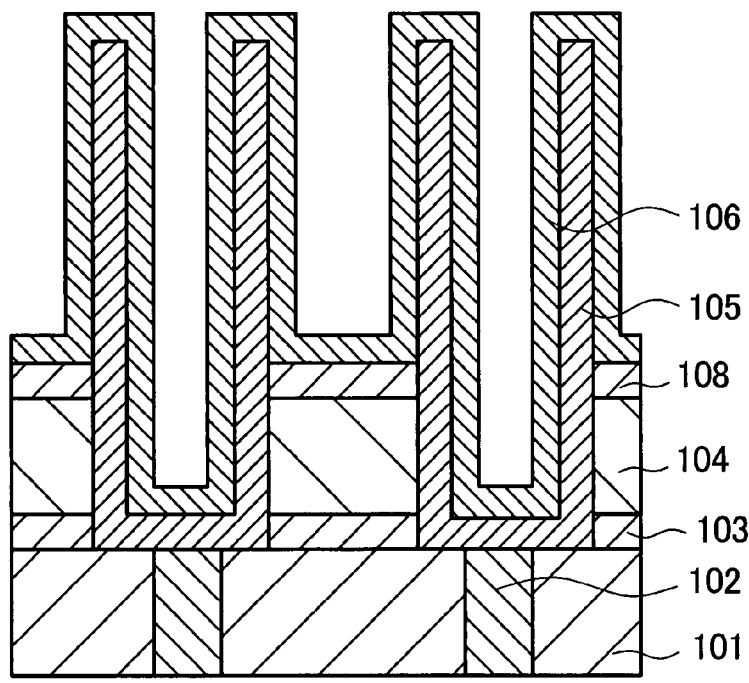

Then, a dielectric film 106 doped with an element having a large ion radius is deposited over the entire surface of the substrate by CVD in the same manner as in the first embodiment, as shown in FIG. 2C.

Figure 2D:
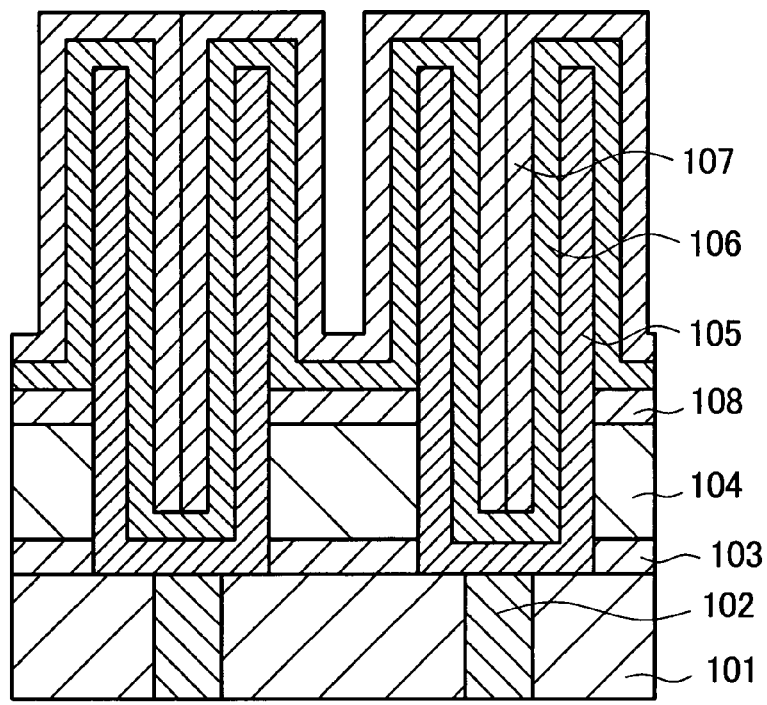

Then, an upper electrode 107 is formed in the same manner as in the first embodiment, as shown in FIG. 2D. This completes the formation of the capacitor made up of the lower electrode 105 of titanium nitride, the dielectric film 106, and the upper electrode 107 of titanium nitride. For example, this capacitor may be coupled in series to a DRAM memory cell select transistor to form a DRAM memory cell.

It should be noted that either the upper or lower electrode or both may be formed of ruthenium instead of titanium nitride. Since ruthenium is conductive even when oxidized, the use of a ruthenium electrode permits the capacitor to have a smaller EOT, as compared to the use of a titanium nitride electrode.

The present embodiment allows formation of an MIM capacitor structure having an EOT of 0.8 nm or less by using a dielectric film doped with an element having a large ion radius. This makes it possible to provide DRAM that meets the 65 nm technology node. Further, according to the present embodiment, portions of the outer sidewalls of the lower electrode are used to form capacitance, which makes it possible either to increase the amount of signal charge stored on the capacitor and thereby enhance the operating reliability of the device, or to reduce the height of the capacitor and thereby reduce the process load.

It should be noted that the present invention is not limited to the preferred embodiments described above. It is obvious that the present invention embraces all means described in the "Summary of the Invention" section of this specification.

Third Embodiment

A third embodiment of the present invention will be described with reference to FIG. 3. The third embodiment provides a DRAM employing the MIM capacitor structure of the first embodiment.

There will be described a method for manufacturing this DRAM.

Figure 3:
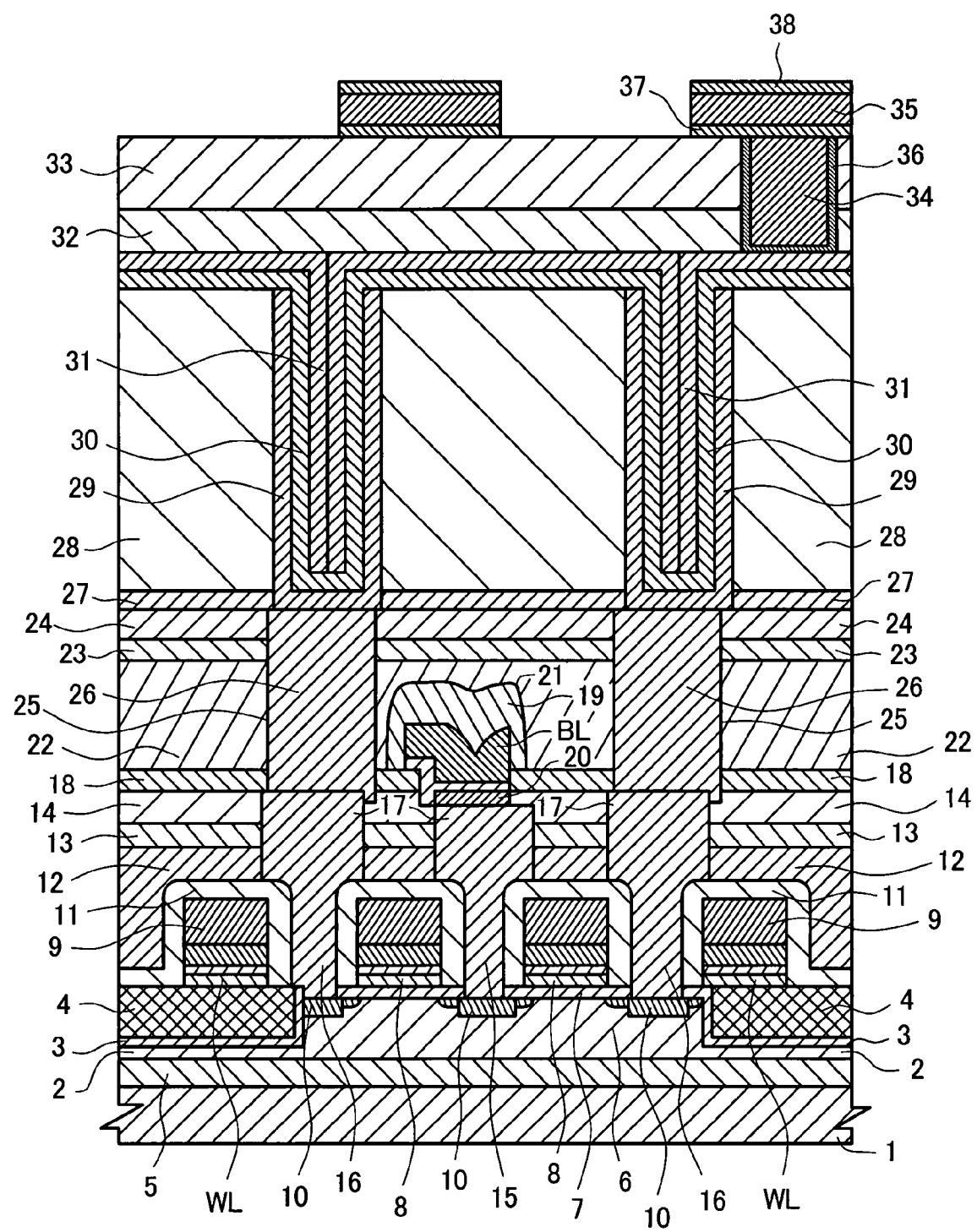
FIG. 3 is a vertical cross-sectional view illustrating a process of manufacturing a DRAM according to a third embodiment of the present invention.

FIG. 3 is a cross-sectional view of the DRAM employing an MIM capacitor structure according to the present embodiment. First, trench isolation regions 4 and an impurity-doped P-type well 6 are formed in the semiconductor substrate 1 in the following manner. First, a P-type single-crystal silicon semiconductor substrate 1 having a specific resistance of approximately 10 Ocm is provided. Then, a thin silicon oxide film (now shown) having a thickness of approximately 10 nm and a silicon nitride film (not shown) having a thickness of approximately 140 nm are formed over the semiconductor substrate 1. More specifically, the silicon oxide film is formed by wet oxidation, e.g., at approximately 850° C., and the silicon nitride film is deposited by CVD. It should be noted that although the present description assumes the semiconductor substrate 1 to be a single-crystal silicon substrate, other types of substrates may be used, such as an SOI (Silicon-On-Insulator) substrate having a single-crystal silicon layer on its surface, or a dielectric substrate of glass or ceramic having a polysilicon film on its surface.

Then, the regions of the above silicon nitride film and silicon oxide film which will become trenches 2 are patterned using a photoresist film (not shown) as a mask, and the semiconductor substrate 1 is dry-etched using the silicon nitride film as a mask, forming the trenches 2 in the semiconductor substrate 1 to a depth of approximately 300-400 nm. (The trench isolation regions 4 are later formed within these trenches 2.)

Then, after removing the above photoresist film, a thin silicon oxide film 3 (having a thickness of approximately 10 nm) is formed on the inner walls of the trenches 2 by wet oxidation, e.g., at approximately 850-900° C. to remove damage left on these walls in the above etching process. Then, a silicon oxide film is deposited to a thickness of approximately 300-400 nm by CVD using, e.g., ozone ($O_3$) and tetraethoxysilane (TEOS) as source gases. This silicon oxide film may be sintered at approximately 1000° C. by dry oxidation.

Then, this silicon oxide film is polished by CMP (Chemical Mechanical Polishing) to remove regions of the film that are not in the trenches 2, thus forming the trench isolation regions (4) within the trenches 2. It should be noted that before this CMP polishing process, a silicon nitride film may be formed over the portion of the silicon oxide film in the trenches 2 to prevent dishing of the surface of the silicon oxide film in the trenches 2, that is, to prevent the silicon oxide film in the trenches 2 from being excessively polished.

Then, the remaining silicon oxide film and silicon nitride film on the surface of the semiconductor substrate 1 are removed, e.g., by wet etching using hot phosphoric acid. After that, an N-type impurity, for example, P (phosphorous), is ion-implanted in the portions of the semiconductor substrate 1 on which memory cells (or a memory array) are formed, thereby forming an N-type semiconductor region 5. Further, a P-type impurity, for example, B (boron), is ion-implanted to form a P-type well 6. After this ion implantation, an impurity for adjusting the threshold voltage of the MISFETs, for example, $BF_2$ (boron fluoride), is ion-implanted in the P-type well 6. The N-type semiconductor region 5 is provided to prevent noise from entering the P-type well 6 of the memory cell array from the input/output circuits, etc. through the semiconductor substrate 1.

Then, after cleaning the surface of the semiconductor substrate 1 using, e.g., an HF (hydrofluoric acid)-based cleaning liquid, the semiconductor substrate 1 is wet oxidized at approximately 850° C. to form a clean gate oxide film 7 on the surface of the P-type well 6 to a thickness of approximately 5 nm. Though not required, after forming the gate oxide film 7, the semiconductor substrate 1 may be heat treated in an NO (nitrogen monoxide) or $N_2O$ (nitrous oxide) atmosphere to segregate nitrogen at the interface between the gate oxide film 7 and the semiconductor substrate 1 (an oxynitriding process). If the gate oxide film 7 has a thickness of approximately 5 nm or less, the distortion at the interface between the gate oxide film 7 and the semiconductor substrate 1 due to the difference between their thermal expansion coefficients is such that hot carrier generation is induced. The nitrogen segregated at the interface between the gate oxide film 7 and the semiconductor substrate 1 acts to reduce this distortion. Thus, the above oxynitriding process can enhance the reliability of a gate insulating film (7) having a very small thickness.

Then, gate electrodes 8 are formed on the gate oxide film 7. Each gate electrode 8 constitutes a part of a memory cell select MISFET, and portions of each gate electrode 8 that are not in the active region are used as a word line WL. The width of the gate electrodes 8 (or word lines WL), that is, the gate length, is set to the smallest value that allows reducing the short channel effects of the memory cell select MISFETs and thereby maintaining the transistor threshold voltage at higher than a predetermined level. Further, the distance between each two adjacent gate electrodes 8 (or word lines WL) is set to the minimum allowable value determined by the resolution limit of the photolithographic process. For example, the gate electrodes 8 (or word lines WL) are formed in the following manner. A polysilicon film doped with an N-type impurity such as P (phosphorous) is deposited onto the semiconductor substrate 1 by CVD to a thickness of approximately 70 nm. Then, a WN (tungsten nitride) film having a thickness of approximately 50 nm and a W film having a thickness of approximately 100 nm are deposited over the polysilicon film by sputtering. Then, after depositing a silicon nitride film 9 onto the W film by CVD to a thickness of approximately 150 nm, these films are patterned using a photoresist film as a mask to form the gate electrodes 8. The WN film acts as a barrier layer to prevent formation of a silicide layer having a high resistance at the interface between the W film and the polysilicon film due to the reaction between them during heat treatment at high temperature. It should be noted that the barrier layer may be a TiN (titanium nitride) film, etc. instead of a WN film. The sheet resistance of the gate electrodes 8 can be reduced to approximately 2-2.5Ω/□ by forming a part of the gate electrodes 8 (or word lines WL) from a low resistance metal (such as W), resulting in reduced word line delay. Thus, the gate electrodes 8 (or word lines WL) need not be lined with Al wiring, etc. in order to reduce the word line delay, which allows reducing the number of wiring layers formed above the memory cells by one.

Then, after removing the photoresist film, the dry etching residues and photoresist residues on the surface of the semiconductor substrate 1 are removed by use of an etchant such as hydrofluoric acid. This wet etching is isotropic and hence etches not only portions of the gate oxide film 7 that are not under the gate electrodes 8, but also portions of the gate oxide film 7 that are under the sidewalls of the gate electrodes 8, which will result in occurrence of undercuts and hence a reduction in the dielectric strength of the gate oxide film 7. To prevent this, the semiconductor substrate 1 is wet oxidized at approximately 900° C. to improve the film quality of the damaged gate oxide film 7.

Then, the P-type well 6 is ion-implanted with an N-type impurity, e.g., P (phosphorous) to form N-type semiconductor regions 10 both sides of the gate electrodes 8. This completes the formation of memory cell select MISFETs for the memory array.

Then, a silicon nitride film 11 is deposited onto the semiconductor substrate 1 by CVD to a thickness of approximately 50-100 nm. After that, an SOG (Spin-On Glass) film 12 is spin coated onto the semiconductor substrate 1 to a thickness of approximately 300 nm and sintered by heat treating the semiconductor substrate 1 at approximately 800° C. for approximately 1 minute. Then, a silicon oxide film 13 is deposited onto the SOG film 12 to a thickness of approximately 600 nm and polished by CMP to planarize its surface. Further, a silicon oxide film 14 is deposited over the silicon oxide film 13 to a thickness of approximately 100 nm to fill the fine polishing scratches on the surface of the silicon oxide film 13 caused by the above CMP process. The silicon oxide films 13 and 14 are deposited by plasma CVD using, e.g., ozone ($O_3$) and tetraethoxysilane (TEOS) as source gases. It should be noted that a PSG (Phosphorous Silicate Glass) film may be deposited instead of the silicon oxide film 14.

Thus, according to the present embodiment, the SOG film 12 having good reflow characteristics is formed above the gate electrodes 8 (or word line WL). Further, the silicon oxide film 13 is deposited over the SOG film 12, and its surface is planarized by CMP. This enhances filling of the small gaps between the gate electrodes 8 (or word lines WL), as well as planarizing the insulating films overlying the gate electrodes 8 (or word lines WL).

Then, the portions of the silicon oxide films 14 and 13 and the SOG film 12 above the N-type semiconductor regions 10 (source, drain) of the memory cell select MISFETs are removed by dry etching using a photoresist film as a mask. This etching is performed under such conditions that the etching rates of the silicon oxide films 14 and 13 and the SOG film 12 are higher than the etching rate of the silicon nitride film 11 so as not to remove the entire portion of the silicon nitride film 11 that covers the N-type semiconductor regions 10 and the device isolation trenches 2. Then, the portions of the silicon nitride film 11 and the gate oxide film 7 on the N-type semiconductor regions 10 (source, drain) of the memory cell select MISFETs are removed to form contact holes 15 and 16 above their respective N-type semiconductor regions 10 (source, drain). This etching is performed under such conditions that the etching rate of the silicon nitride film 11 is higher than the etching rates of the silicon oxide films (namely, the gate oxide film 7 and the silicon oxide films 4 within the device isolation trenches 2) so as not to deeply etch the N-type semiconductor regions 10 and the device isolation trenches 2. Further, this etching process anisotropically etches the silicon nitride film 11 such that the silicon nitride film 11 remains on the sidewalls of the gate electrodes 8 (or word lines WL). As a result, the contact holes 15 and 16 (which have a diameter smaller than the resolution limit of the photolithographic process) are formed in a self-aligned manner with respect to the gate electrodes 8 (or word lines WL). It should be noted that an alternative way to form the contact holes 15 and 16 in a self-aligned manner with respect to the gate electrodes 8 (or word lines WL) is to anisotropically etch the silicon nitride film 11 to form sidewall spacers on the sidewalls of the gate electrodes 8 (or word lines WL) beforehand.

Then, after removing the photoresist film, the dry etching residues and the photoresist residues on the substrate surface exposed at the bottoms of the contact holes 15 and 16 are removed using an etchant such as a mixed solution of hydrofluoric acid and ammonium fluoride. At that time, the SOG film 12 exposed at the sidewalls of the contact holes 15 and 16 is also subjected to the etchant. However, since the etching rate of the SOG film 12 by hydrofluoric acid-based etchant has been reduced by sintering at approximately 800° C. at a previous step (as described above), there is no possibility that the sidewalls of the contact holes 15 and 16 are significantly undercut by this wet etching process. As a result, it is possible to reliably prevent shorting between the plugs (17) formed in the contact holes 15 and 16 at a later step.

Then, plugs 17 are formed in the contact holes 15 and 16 in the following manner. A polysilicon film doped with an N-type impurity such as P (phosphorous) is deposited over the silicon oxide film 14 and polished by CMP to remove portions of the polysilicon film that are not in the contact holes 15 and 16, thus forming the plugs 17 in the contact holes 15 and 16.

Then, after depositing a silicon oxide film 18 onto the silicon oxide film 14 to a thickness of approximately 200 nm, the semiconductor substrate 1 is heat treated at approximately 800° C. More specifically, the silicon oxide film 18 is deposited by plasma CVD using, e.g., ozone ($O_3$) and tetraethoxysilane (TEOS) as source gases. The above heat treatment causes N-type impurities in the polysilicon films constituting the plugs 17 to diffuse from the bottom portions of the contact holes 15 and 16 (or plugs 17) to the N-type semiconductor regions (source, drain) 10 of the memory cell select MISFETs, thereby reducing the resistance of the N-type semiconductor regions 10.

Then, the portion of the silicon oxide film 18 on the contact hole 15 is removed by dry etching using a photoresist film as a mask to expose the surface of the plug 17 in the contact hole 15. Then, after removing the photoresist film, bit lines BL are formed on the silicon oxide film 18 in the following manner. First, a Ti film is deposited onto the silicon oxide film 18 by sputtering to a thickness of approximately 50 nm, and the semiconductor substrate 1 is heat treated at approximately 800° C. Then, a TiN film is deposited onto the Ti film by sputtering to a thickness of approximately 50 nm, and a W film and a silicon nitride film 19 are deposited over the TiN film by CVD to thicknesses of 150 nm and 200 nm, respectively. After that, these films are patterned using a photoresist film as a mask, forming the bit lines BL. Thus, the semiconductor substrate 1 is heat treated at approximately 800° C. after depositing the Ti film onto the silicon oxide film 18. This heat treatment causes the Ti film to react with the underlying Si to form a $TiSi_2$ (titanium silicide) layer 20 on the surfaces of the plugs 17 and thereby reduces the contact resistance between the plugs 17 and the wires (namely, the bit lines BL) coupled to the plugs 17. Further, since the bit lines BL are made up of the W film, the TiN film, and the Ti film, its sheet resistance can be reduced to 2Ω/□ or less, allowing the data read/write rates to be increased. These bit lines BL are formed such that the distance between adjacent bit lines BL is larger than their width to reduce the parasitic capacitance between the bit lines BL and thereby increase the data read/write rates. The distance between the bit lines BL is, for example, approximately 0.1 μm and their width is, for example, approximately 0.1 μm. It should be noted that the $TiSi_2$ layer 20 may degrade if subjected to heat treatment. In this DRAM manufacturing process, the $TiSi_2$ layer 20 is subjected to heat treatment in the step of forming the capacitive insulating film of data storage capacitors, as described later. However, according to the present embodiment, this capacitive insulating film forming step is performed at reduced temperature to prevent degradation of the $TiSi_2$ layer 20 due to the heat treatment and thereby prevent an increase in the connection resistance.

Then, sidewall spacers 21 are formed on the sidewalls of the bit lines BL by depositing a silicon nitride film onto the bit lines BL by CVD and anisotropically etching the deposited silicon nitride film.

Then, an SOG film 22 is spin coated onto the bit lines BL to a thickness of approximately 300 nm. After that, the semiconductor substrate 1 is heat treated at approximately 800° C. for approximately 1 minute to sinter the SOG film 22. The SOG film 22 has good reflow characteristics (as compared to BPSG films) and good gap fill characteristics, meaning that the SOG film 22 can be formed to fully fill the small gaps between the bit lines BL (as small as the resolution limit of the photolithographic process). Further, unlike a BPSG film, the SOG film 22 does not require extended high-temperature heat treatment to achieve enhanced reflow characteristics. This allows for a reduction in the thermal diffusion of the impurities contained in the sources and drains of the memory cell select MISFETs formed under the bit lines BL, resulting in shallower junctions. Further, the SOG film 22 prevents the degradation of the metal (or W film) constituting the gate electrodes 8 (or word lines WL), thereby allowing enhancement of the performance of the MISFETs constituting the DRAM memory cells and the peripheral circuitry. Further, it also prevents the degradation of the Ti film, the TiN film, and the W film, resulting in reduced wiring resistance.

Then, a silicon oxide film 23 is deposited over the SOG film 22 to a thickness of approximately 600 nm and polished by CMP to planarize its surface. More specifically, the silicon oxide film 23 is deposited by plasma CVD using, e.g., ozone ($O_3$) and tetraethoxysilane (TEOS) as source gases. Thus, according to the present embodiment, the SOG film 22 is coated onto the bit lines BL. (The SOG film 22 has enhanced flatness even right after its formation.) Furthermore, the silicon oxide film 23 is deposited over the SOG film 22 and planarized by CMP, as described above. With this arrangement, it is possible to enhance filling of the small gaps between the bit lines BL, as well as planarizing the insulating films overlying the bit lines BL. Further, since the above process does not require extended high-temperature heat treatment, the degradation of the characteristics of the MISFETs constituting the memory cells and peripheral circuitry can be avoided, resulting in enhanced performance of the DRAM and reduced resistance of the bit lines BL.

Then, a silicon oxide film 24 is deposited onto the silicon oxide film 23 to a thickness of approximately 100 nm to fill the fine polishing scratches on the surface of the silicon oxide film 23 caused by the above CMP process. More specifically, the silicon oxide film 24 is deposited by plasma CVD using, e.g., ozone ($O_3$) and tetraethoxysilane (TEOS) as source gases.

Then, the silicon oxide films 24 and 23, the SOG film 22, and the silicon oxide film 18 are partially removed using a photoresist film as a mask to form through-holes 25 reaching the surface of their respective plugs 17. This etching is performed under such conditions that the etching rates of the silicon nitride films (overlying the bit lines BL) are lower than the etching rates of the silicon oxide films 24, 23, and 18 and the SOG film 22 so as not to deeply etch the silicon nitride film 19 and the sidewall spacers 21 overlying the bit lines BL even when the through-holes 25 are misaligned with the bit lines BL. In this way, the through-holes 25 are formed in a self-aligned manner with respect to the bit lines BL.

Then, after removing the photoresist film, the dry etching residues and the photoresist residues on the surfaces of the plugs 17 exposed at the bottoms of the through-holes 25 are removed using an etchant such as a mixed solution of hydrofluoric acid and ammonium fluoride. At that time, the SOG film 22 exposed at the sidewalls of the through-holes 25 is also subjected to the etchant. However, since the etching rate of the SOG film 22 by hydrofluoric acid-based etchant has been reduced by sintering at approximately 800° C. at a previous step (as described above), there is no possibility that the sidewalls of the through-holes 25 are significantly undercut by this wet etching process. In this way, it is possible to reliably prevent shorting between the bit lines BL and the plugs (26) formed in the through-holes 25 at a later step. Further, these plugs can be spaced a sufficient distance apart from the bit lines BL to reduce the parasitic capacitance of the bit lines BL.

Then, plugs 26 are formed in the through-holes 25 in the following manner. A polysilicon film doped with an N-type impurity such as P (phosphorous) is deposited over the silicon oxide film 24 and polished by CMP to remove portions of the polysilicon film that are not in the through-holes 25, thus forming the plugs 26 in the through-holes 25.

Then, after forming a silicon nitride film 27 and an insulating film 28, trenches are formed in these films to expose the plugs 26. Specifically, the insulating film 28 is formed by plasma CVD using, e.g., ozone ($O_3$) and tetraethoxysilane (TEOS) as source gases. Further, the trenches are formed by etching using a photoresist film as a mask.

Then, a lower electrode 29, a dielectric film 30, and an upper electrode 31 are formed in the same manner as in the first embodiment. This completes the formation of data storage capacitors (or capacitive elements) that include: the lower electrode 29 of titanium nitride or ruthenium; the electric film 30 made up of a $Y_2O_3$-doped $HfO_2$ film, a $Y_2O_3$-doped $ZrO_2$ film, an $La_2O_3$-doped $HfO_2$ film, or an $La_2O_3$-doped $ZrO_2$ film, etc.; and the upper electrode 31 of titanium nitride or ruthenium. These data storage capacitors and the memory cell select MISFETs connected to them form DRAM memory cells.

Then, after removing the photoresist film, a silicon oxide film 32 is deposited over the data storage capacitors to a thickness of approximately 40 nm. Specifically, the silicon oxide film 32 is deposited by plasma CVD using, e.g., ozone ($O_3$) and tetraethoxysilane (TEOS) as source gases. Further, an SOG film 33 is coated over the silicon oxide film 32 to planarize the regions overlying the memory cells and reduce the height difference between the memory cell region and the peripheral circuitry region.

Then, the SOG film 33 and the silicon oxide film 32 are partially removed using a photoresist film as a mask to form a through-hole. After that, a plug 34 is formed in the through-hole, and second-layer wiring 35 is formed on the SOG film 33. Specifically, the plug 34 is formed in the following manner. First, a TiN film 36 is deposited onto the SOG film 33 by sputtering to a thickness of approximately 100 nm, and a W film (34) is deposited onto the TiN film 36 to a thickness of approximately 500 nm. Then, these films are etched back to leave them in the through-hole, thus forming the plug 34. On the other hand, the second-layer wiring 35 is formed in the following manner. First, a TiN film 37, an Al (aluminum) film (35), and a Ti film are sequentially deposited over the SOG film 33 by sputtering. (The TiN film 37 has a thickness of approximately 50 nm; the Al film (35) has a thickness of approximately 500 nm; and a Ti film 38 has a thickness of approximately 50 nm.) Then, these films are patterned using a photoresist film as a mask to form the second-layer wiring 35.

Then, though not shown, an interlayer insulating film and third-layer wiring are sequentially formed, and a passivation film made up of a silicon oxide film and a silicon nitride film is deposited onto the third-layer wiring. It should be noted that the third-layer wiring and the plugs coupled to them are formed in the same manner as the second-layer wiring and the plugs coupled connected to them. The interlayer insulating film may be made up of a silicon oxide film having a thickness of approximately 300 nm, an SOG film having a thickness of approximately 400 nm, and a silicon oxide film having a thickness of approximately 300 nm. These silicon oxide films may be deposited by plasma CVD using, e.g., ozone ($O_3$) and tetraethoxysilane (TEOS) as source gases.

The above step substantially completes the formation of the DRAM of the present embodiment.

The present embodiment allows formation of an MIM capacitor structure having an EOT of 0.8 nm or less by using a dielectric film doped with an element having a large ion radius. This makes it possible to provide DRAM that meets the 65 nm technology node.

Although the DRAM of the present embodiment has the MIM capacitor structure of the first embodiment, the MIM capacitor structure of the second embodiment may be applied to DRAM. In such a case, since portions of the outer sidewalls of the lower electrode form capacitance, it is possible either to increase the amount of signal charge stored on the capacitor and thereby enhance the operating reliability of the device, or to reduce the height of the capacitor and thereby reduce the process load, as compared to the first embodiment.

It should be noted that the present invention is not limited to the preferred embodiments described above. It is obvious that the present invention embraces all means described in the "Summary of the Invention" section of this specification.

Fourth Embodiment

Figure 4A:
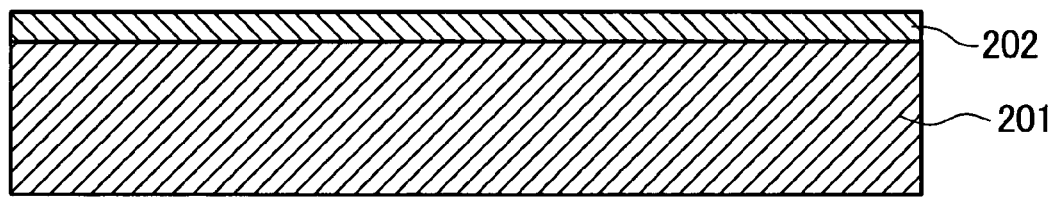
FIGS. 4A to 4C are vertical cross-sectional views illustrating sequential process steps for forming an MIM capacitor structure according to a fourth embodiment of the present invention.

A fourth embodiment of the present invention will be described with reference to FIGS. 4A to 4C. This embodiment provides a process of forming a planar MIM capacitor structure by using a dielectric film doped with an element having a large ion radius. This MIM capacitor structure is suitable for integrating an RF analog device and a CMOS logic device on a single chip.

First, a lower electrode 201 of copper (Cu) is formed. Then, a barrier layer 202 of TaN, etc. is formed on the lower electrode 201, as shown in FIG. 4A. The reason for forming the barrier layer 202 before forming the dielectric film is that Cu has a large diffusion coefficient.

Figure 4B:
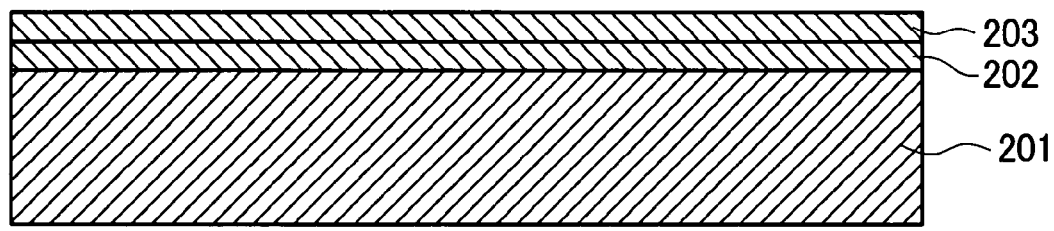

Then, a dielectric film 203 doped with an element having a large ion radius is deposited over the entire surface of the substrate, as shown in FIG. 4B. The dielectric film 203 may be, for example, a $Y_2O_3$-doped $HfO_2$ film, a $Y_2O_3$-doped $ZrO_2$ film, an $La_2O_3$-doped $HfO_2$ film, or an $La_2O_3$-doped $ZrO_2$ film. The thickness of the dielectric film 203 must be at least 5 nm to directly control the tunneling current, and be 10 nm or less to provide a sufficient capacitance. The dielectric film 203 is preferably amorphous to reduce the leakage current along the crystal grain boundaries. However, the dielectric film 203 may be made of a polycrystalline dielectric if its leakage current density does not exceed the maximum allowable value.

Figure 4C:
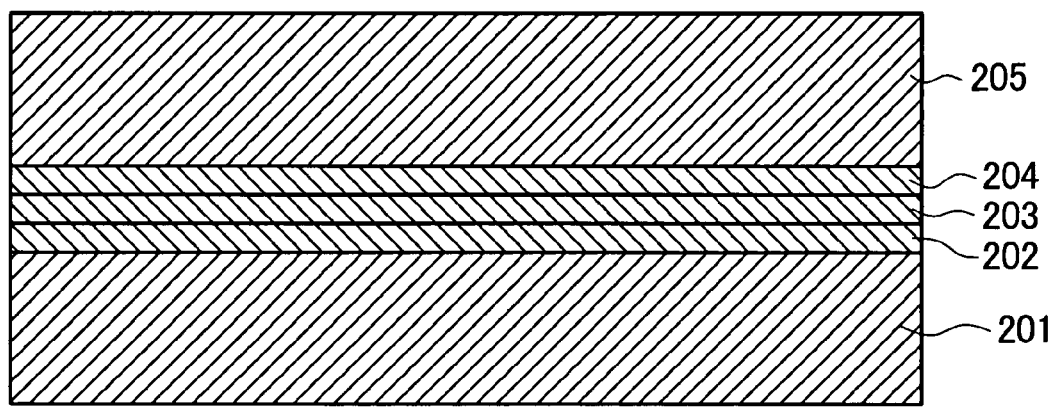

Then, after forming a barrier layer 204 of TaN, etc., an upper electrode 205 of Cu is formed, as shown in FIG. 4C.

This completes the formation of a data storage capacitor (or capacitive element) that includes: the lower electrode 201 of Cu; the dielectric film 203 made up of a $Y_2O_3$-doped $HfO_2$ film, a $Y_2O_3$-doped $ZrO_2$ film, an $La_2O_3$-doped $HfO_2$ film, or an $La_2O_3$-doped $ZrO_2$ film; and the upper electrode 205 of Cu. It should be noted that after the above process, an appropriate process is performed to process each layer of this capacitor to desired shape and dimensions.

The present embodiment allows formation of an MIM capacitor structure having an EOT of 0.8 nm or less by using a dielectric film doped with an element having a large ion radius. More specifically, the present embodiment provides a planar MIM capacitor structure that can store an increased amount of charge. This MIM capacitor structure is suitable for integrating an RF analog device and a CMOS logic device on a single chip.

It should be noted that the present invention is not limited to the preferred embodiments described above. It is obvious that the present invention embraces all means described in the "Summary of the Invention" section of this specification.

Fifth Embodiment

Figure 5:
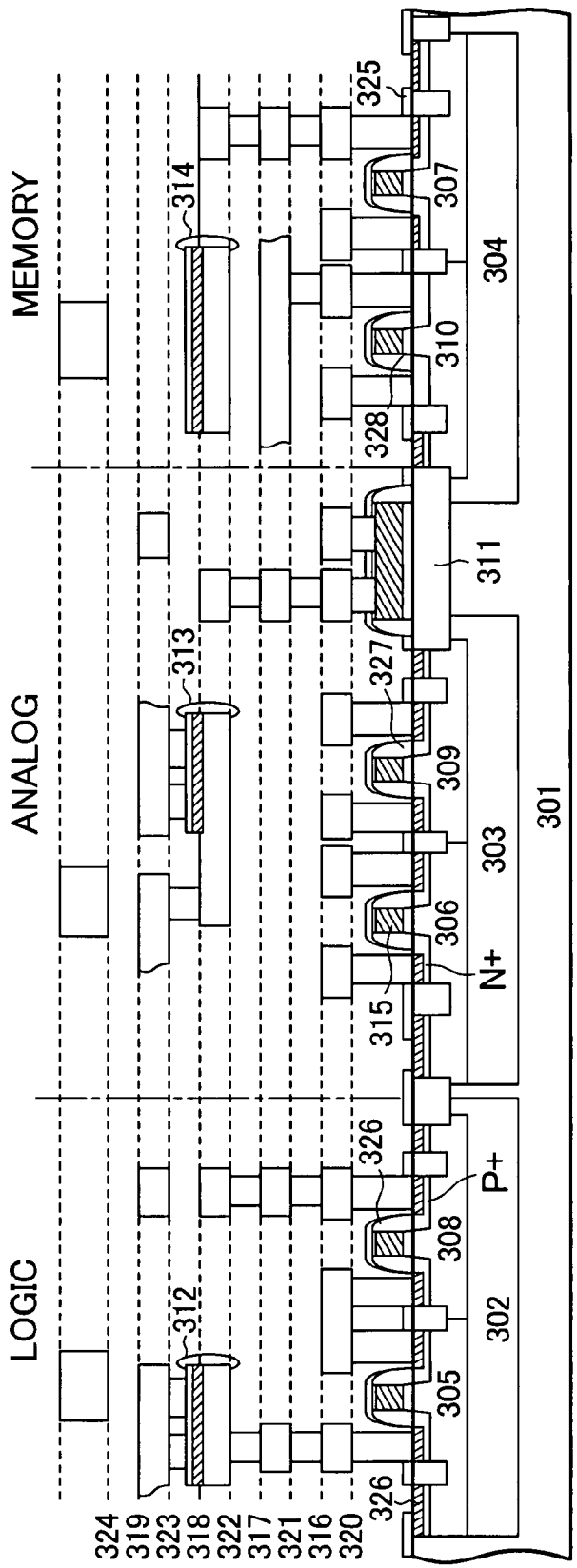
FIG. 5 is a vertical cross-sectional view illustrating a process of manufacturing a semiconductor integrated circuit device according to a fifth embodiment of the present invention.

A fifth embodiment of the present invention provides a semiconductor integrated circuit device that includes an RF analog device and a CMOS logic device integrated on the same chip. FIG. 5 is a cross-sectional view of the structure of the semiconductor integrated circuit device of the present embodiment, showing its logic, analog, and memory blocks. In FIG. 5, reference numerals 312, 313, and 314 denote MIM capacitors such as that of the fourth embodiment. Although the present description is directed to a CMOS structure, it is to be understood that the present invention can be applied to the so-called BiCMOS structure, which includes both bipolar and CMOS transistors. Referring to FIG. 5, the logic, analog, and memory blocks are formed on a single P-type silicon substrate P-SUB. Island-shaped N-well regions 302, 303, and 304 are formed in the P-type silicon substrate P-SUB. As shown in FIG. 5, the N-well region 302 includes an N-well region 305 and a P-well region 308; the N-well region 303 includes an N-well region 306 and a P-well region 309; and the N-well region 304 includes an N-well region 307 and a P-well region 310. Further, the N-well regions 305, 306, and 307 each has a PMOS transistor formed therein, while the P-well regions 308, 309, and 310 each has an NMOS transistor formed therein. Power feeder blocks are provided adjacent the transistors to supply power to the N- and P-well regions. Further, the analog block includes a resistive component (a polysilicon wiring layer 315). Further, reference numeral 328 denotes a gate oxide film; 326, a silicide layer; 327, a side spacer; and 325, a silicon nitride film.

Referring still to FIG. 5, the transistors in the logic block are silicided. However, siliciding a transistor may result in an increase in the leakage current in the diffusion layer regions. In the case of the memory block, if a silicided transistor is used in a memory cell, the data storage characteristics of the memory cell may degrade. Therefore, the NMOS transistor formed in the P-well region 310 may not be silicided to avoid degradation of the memory cell. Further, the polysilicon wiring layer 315 has a high resistance if it is not silicided. Therefore, tungsten (W), etc. may be laminated onto the polysilicon wiring layer 315, forming a so-called polymetal structure. Or, it is possible to employ a transistor structure in which only the surface of the polysilicon wiring layer 315 is selectively silicided and hence the diffusion layer regions are not silicided. Of course, the transistors in the memory block may also be silicided, as in the logic block, if the leakage current is low enough not to adversely affect the data storage characteristics. Such a process does not require a mask for selective silicidation, resulting in reduced cost.

The semiconductor integrated circuit device shown in FIG. 5 has the so-called three-well structure. The logic, analog, and memory blocks are isolated by the N-well regions 302, 303, and 304, respectively. Thus, the regions in the logic, analog, and memory blocks can be electrically isolated so as not to interfere with each other's operation, resulting in stable operation of the device. Further, appropriate N- and P-well potentials can be set for each block, separately, based on the operating voltage of the block. It should be noted that various alterations may be made to this embodiment. For example, the N-well regions 302, 303, and 304 may be omitted from the above three-well structure, that is, the semiconductor integrated circuit device may have a simple well structure, if the specifications permit. Further, only the memory block or only the memory and analog blocks may be isolated by the N-well regions 303 and 304. Further, two regions may be surrounded by the same N-well region.

In FIG. 5, the broken lines above the substrate indicate the locations of metal wiring layers (320 to 324) and their contact layers (316 to 319). MIM capacitors 312, 313, and 314 are used in the logic, analog, and memory blocks, respectively. For example, in the logic block, the MIM capacitor (312) may be coupled to the wiring connected to a power source to increase the capacitance of the power source and thereby stabilize its operation. This arrangement may also be applied to the analog and memory blocks. Further, the analog block may use the MIM capacitor (313) as a capacitive element, and the memory block may use the MIM capacitor (314) as a memory cell, as described later.

In conventional 1T1C cells, the lower electrode of the memory capacitor is made of polysilicon, which has high thermal resistance, and the upper electrode is made of a metal having oxidation resistance, such as TiN. This means that the metal wiring layers used in the logic block are difficult to use as capacitor electrodes in the memory block. On the other hand, the MIM capacitors (312 to 314) of the present embodiment use, e.g., the third metal wiring layer 322 as their lower electrodes. After forming each lower electrode, a capacitor dielectric film (made up of a film stack) is formed on it and then an upper electrode is formed on each dielectric film. At that time, these upper electrodes are formed in the via hole layer 318 between the fourth metal wiring layer 323 and the third metal wiring layer 322. Thus, each capacitor uses a wiring layer as its lower electrode. This means that forming the lower electrodes of the capacitors in the logic, analog, and memory blocks does not require a special process. Thus, unlike a conventional 1T1C cell, which has a three dimensional structure, the capacitor of the above memory block (and those of the logic and analog blocks) has a planar structure, which facilitates utilizing the metal wiring layers of the logic block. Further, such a capacitor can be easily formed, resulting in high yield. Further, the wiring layers may be metal wiring predominantly composed of, e.g., Al or Cu.

Though not shown in the figure, a barrier metal may be formed on each wiring layer. Examples of barrier metals include TiN and TaN.

In the semiconductor integrated circuit device of the present embodiment as described above, the memory, logic, and analog blocks include MIM capacitors having a simple planar structure. Such capacitors can be easily formed, resulting in reduced process cost. Further, since these MIM capacitors in the memory, logic, and analog blocks use a wiring layer as their electrodes, they can have the same structure and can be formed of the same material, resulting in reduced cost and enhanced reliability and yield.

Thus, the present embodiment allows formation of an MIM capacitor structure having an EOT of 0.8 or less by using a dielectric film doped with an element having a large ion radius. More specifically, the present embodiment provides a planar MIM capacitor structure that is suitable for integrating an RF analog device and a CMOS logic device on a single chip and that can store an increased amount of signal charge, allowing for enhanced operating reliability of the devices. It should be noted that the present invention is not limited to the preferred embodiments described above. It is obvious that the present invention embraces all means described in the "Summary of the Invention" section of this specification.

Although the present invention has been specifically described based on preferred embodiments thereof, it should be understood that the invention is not limited to these embodiments and various alterations may be made thereto without departing from the scope and spirit of the invention. For example, the capacitor structures of the first, second, and fourth embodiments can be applied not only to DRAM, but also to any semiconductor device that includes DRAM or capacitors.

The following are the major aspects of the present invention, which has been described with reference to specific embodiments thereof.

(1) A first aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made of a solid solution of hafnium oxide and yttrium oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(2) A second aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode made up of a layer stack of hafnium oxide and yttrium oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(3) A third aspect of the present invention provides the semiconductor memory device as described in item #1 or #2 above, wherein the upper and lower electrodes are made of titanium nitride or ruthenium.

(4) A fourth aspect of the present invention provides the semiconductor memory device as described in item #1 or #2 above, wherein the dielectric is an amorphous film.

(5) A fifth aspect of the present invention provides the semiconductor memory device as described in item #2 above, wherein the layer stack of hafnium oxide and yttrium oxide is formed such that the hafnium oxide is in contact with the lower electrode.

(6) A sixth aspect of the present invention provides the semiconductor memory device as described in item #2 above, wherein the layer stack of hafnium oxide and yttrium oxide is formed such that the yttrium oxide is in contact with the lower electrode.

(7) A seventh aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made of a solid solution of hafnium oxide and lanthanum oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(8) An eighth aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made up of a layer stack of hafnium oxide and lanthanum oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(9) A ninth aspect of the present invention provides the semiconductor memory device as described in item #7 or #8 above, wherein the upper and lower electrodes are made of titanium nitride or ruthenium.

(10) A tenth aspect of the present invention provides the semiconductor memory device as described in item #7 or #8 above, wherein the dielectric is an amorphous film.

(11) An eleventh aspect of the present invention provides the semiconductor memory device as described in item #8 above, wherein the layer stack of hafnium oxide and lanthanum oxide is formed such that the hafnium oxide is in contact with the lower electrode.

(12) A twelfth aspect of the present invention provides the semiconductor memory device as described in item #8 above, wherein the layer stack of hafnium oxide and lanthanum oxide is formed such that the lanthanum oxide is in contact with the lower electrode.

(13) A thirteenth aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made of a solid solution of zirconium oxide and yttrium oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(14) A fourteenth aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made up of a layer stack of zirconium oxide and yttrium oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(15) A fifteenth aspect of the present invention provides the semiconductor memory device as described in item #13 or #14 above, wherein the upper and lower electrodes are made of titanium nitride or ruthenium.

(16) A sixteenth aspect of the present invention provides the semiconductor memory device as described in item #13 or #14 above, wherein the dielectric is an amorphous film.

(17) A seventeenth aspect of the present invention provides the semiconductor memory device as described in item #14 above, wherein the laser stack of zirconium oxide and yttrium oxide is formed such that the zirconium oxide is in contact with the lower electrode.

(18) An eighteenth aspect of the present invention provides the semiconductor memory device as described in item #14 above, wherein the layer stack of zirconium oxide and yttrium oxide is formed such that the yttrium oxide is in contact with the lower electrode.

(19) A nineteenth aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made of a solid solution of zirconium oxide and lanthanum oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(20) A twentieth aspect of the present invention provides a semiconductor memory device comprising: a substrate; a MOS transistor disposed on the substrate; a plug electrically connected to a source region or a drain region of the MOS transistor; a lower electrode of a metal material electrically connected to the plug; a dielectric disposed on the lower electrode and made up of a layer stack of zirconium oxide and lanthanum oxide; and an upper electrode of a metal material disposed on the dielectric; wherein the upper and lower electrodes and the dielectric form a capacitor; and wherein the dielectric is a film formed by chemical vapor deposition to a thickness of 5 nm-10 nm.

(21) A twenty-first aspect of the present invention provides the semiconductor memory device as described in item #19 or #20 above, wherein the upper and lower electrodes are made of titanium nitride or ruthenium.

(22) A twenty-second aspect of the present invention provides the semiconductor memory device as described in item #19 or #20 above, wherein the dielectric is an amorphous film.

(23) A twenty-third aspect of the present invention provides the semiconductor memory device as described in item #20 above, wherein the layer stack of zirconium oxide and lanthanum oxide is formed such that the zirconium oxide is in contact with the lower electrode.

(24) A twenty-fourth aspect of the present invention provides the semiconductor memory device as described in item #20 above, wherein the layer stack of zirconium oxide and lanthanum oxide is formed such that the lanthanum oxide is in contact with the lower electrode.

DESCRIPTION OF REFERENCE NUMERALS

1 ... semiconductor substrate
2 ... trench
3, 4 ... silicon oxide film
5 ... N-type semiconductor region
6 ... P-type well
7 ... gate oxide film
8 ... gate electrode
9 ... silicon nitride film
10 ... N-type semiconductor region
11 ... silicon nitride film
12 ... SOG film
13, 14 ... silicon oxide film
15, 16 ... contact hole
17 ... plug
18 ... silicon oxide film
19 ... silicon nitride film
20 ... $TiSi_2$ layer
21 ... sidewall spacer
22 ... SOG film
23, 24 ... silicon oxide film
25 ... through-hole
26 ... plug
27 ... silicon nitride film
28 ... insulating film
29 ... lower electrode
30 ... dielectric film
31 ... upper electrode
32 ... silicon oxide film
33 ... SOG film
34 ... plug
35 ... second-layer wiring
36, 37 ... TiN film
38 ... Ti film
101 ... plug section interlayer insulating film
102 ... plug
103 ... silicon nitride film
104 ... capacitor section interlayer insulating film
105 ... lower electrode
106 ... dielectric film
107 ... upper electrode
108 ... silicon nitride film
109 ... capacitor section interlayer insulating film
201 ... lower electrode
202 ... barrier layer
203 ... dielectric film
204 ... barrier layer
205 ... upper electrode
301 ... P-type silicon substrate
302 to 307 ... N-well region
308 to 310 ... P-well region
311 ... device isolation oxide film
312 to 314 ... MIM capacitor
315 ... polysilicon wiring layer
316 to 319 ... via hole
320 ... first metal wiring layer
321 ... second metal wiring layer
322 ... third metal wiring layer
323 ... fourth metal wiring layer
324 ... fifth metal wiring layer
325 ... silicon nitride film
326 ... silicide layer
327 ... side spacer
328 ... gate oxide film

What is claimed is:

1. A semiconductor memory device comprising:
a substrate;
a MOS transistor disposed on said substrate;
a plug electrically connected to a source region or a drain region of said MOS transistor;
a lower electrode of a metal material electrically connected to said plug;
a dielectric layer disposed on said lower electrode and made of an amorphous solid solution of a base material comprising hafnium oxide and an oxide dopant comprising yttrium oxide, wherein the proportion of the oxide dopant comprising yttrium oxide in the amorphous solid solution is in a range from about 5 percent to about 50 percent; and
an upper electrode of a metal material disposed on said dielectric layer,
wherein said upper and lower electrodes and said dielectric layer form a capacitor.

2. A semiconductor memory device comprising:
a substrate;
a MOS transistor disposed on said substrate;
a plug electrically connected to a source region or a drain region of said MOS transistor;
a lower electrode of a metal material electrically connected to said plug;
a dielectric layer disposed on said lower electrode and made of an amorphous solid solution of a base material comprising hafnium oxide and an oxide dopant comprising lanthanum oxide, wherein the proportion of the oxide dopant comprising lanthanum oxide in the amorphous solid solution is in a range from about 5 percent to about 50 percent; and
an upper electrode of a metal material disposed on said dielectric layer,
wherein said upper and lower electrodes and said dielectric layer form a capacitor.

3. A semiconductor memory device comprising:
a substrate;
a MOS transistor disposed on said substrate;
a plug electrically connected to a source region or a drain region of said MOS transistor;
a lower electrode of a metal material electrically connected to said plug;
a dielectric layer disposed on said lower electrode and made of an amorphous solid solution of a base material comprising zirconium oxide and an oxide dopant comprising yttrium oxide, wherein the proportion of the oxide dopant comprising yttrium oxide in the amorphous solid solution is in a range from about 5 percent to about 50 percent; and
an upper electrode of a metal material disposed on said dielectric layer,
wherein said upper and lower electrodes and said dielectric layer form a capacitor.

4. A semiconductor memory device comprising:
a substrate;
a MOS transistor disposed on said substrate;
a plug electrically connected to a source region or a drain region of said MOS transistor;
a lower electrode of a metal material electrically connected to said plug;
a dielectric layer disposed on said lower electrode and made of an amorphous solid solution of a base material comprising zirconium oxide and an oxide dopant comprising lanthanum oxide, wherein the proportion of the oxide dopant comprising lanthanum oxide in the amorphous solid solution is in a range from about 5 percent to about 50 percent; and
an upper electrode of a metal material disposed on said dielectric layer, wherein said upper and lower electrodes and said dielectric layer form a capacitor.

* * * * *